(12) United States Patent
Miyake et al.

(10) Patent No.: US 8,013,344 B2
(45) Date of Patent: Sep. 6, 2011

(54) METHOD OF MANUFACTURING SEMICONDUCTOR DEVICE AND SEMICONDUCTOR DEVICE

(75) Inventors: Yasuto Miyake, Hirakata (JP); Ryoji Hiroyama, Kyo-tanabe (JP); Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 133 days.

(21) Appl. No.: 12/186,168

(22) Filed: Aug. 5, 2008

(65) Prior Publication Data

US 2009/0039473 A1 Feb. 12, 2009

(30) Foreign Application Priority Data

Aug. 6, 2007 (JP) ................................. 2007-203748

(51) Int. Cl.
*H01L 27/15* (2006.01)
(52) U.S. Cl. ............ 257/79; 257/E21.276; 257/E29.003
(58) Field of Classification Search .................... 257/79, 257/E21.476, E29.003
See application file for complete search history.

(56) References Cited

U.S. PATENT DOCUMENTS

| 6,468,882 B2 | 10/2002 | Motoki et al. | |
|---|---|---|---|
| 2004/0127042 A1* | 7/2004 | Nagasawa et al. | 438/689 |
| 2005/0025205 A1* | 2/2005 | Ryowa et al. | 372/44 |
| 2005/0035359 A1* | 2/2005 | Ishida et al. | 257/94 |
| 2005/0042787 A1 | 2/2005 | Ito et al. | |
| 2005/0224783 A1* | 10/2005 | Matsuyama et al. | 257/14 |

FOREIGN PATENT DOCUMENTS

| JP | 2002-029897 A | 1/2002 |
|---|---|---|
| JP | 2003-133649 A | 5/2003 |

OTHER PUBLICATIONS

Sakai, A. et al., Reduction of Dislocation Density in GaN Films by Epitaxial Lateral Overgrowth, Applied Physics, 1999, pp. 774-779, vol. 68, No. 7.

* cited by examiner

*Primary Examiner* — Matthew Reames
(74) *Attorney, Agent, or Firm* — Ditthavong Mori & Steiner, P.C.

(57) ABSTRACT

A method of manufacturing a semiconductor device includes steps of forming a semiconductor device layer on an upper surface of a substrate including the upper surface, a lower surface and a dislocation concentrated region arranged so as to part a first side closer to the upper surface and a second side closer to the lower surface, exposing a portion where the dislocation concentrated region does not exist above on the lower surface by removing the substrate on the second side along with at least a part of the dislocation concentrated region, and forming an electrode on the portion.

10 Claims, 14 Drawing Sheets

METHOD OF MANUFACTURING SEMICONDUCTOR DEVICE AND SEMICONDUCTOR DEVICE

CROSS-REFERENCE TO RELATED APPLICATIONS

The priority application number JP2007-203748, Method of Manufacturing Semiconductor Device and Semiconductor Device, Aug. 6, 2007, Yasuto Miyake et al, upon which this patent application is based is hereby incorporated by reference.

BACKGROUND OF THE INVENTION

1. Field of the Invention

The present invention relates to a method of manufacturing a semiconductor device and a semiconductor device, and more particularly, it relates to a method of manufacturing a semiconductor device comprising a step of forming a substrate including a dislocation concentrated region and a semiconductor device comprising a substrate including a dislocation concentrated region.

2. Description of the Background Art

A method of manufacturing a substrate including a dislocation concentrated region is known in general, as disclosed in Japanese Patent Laying-Open Nos. 2002-29897 and 2003-133649, for example.

The aforementioned Japanese Patent Laying-Open No. 2002-29897 discloses a method of manufacturing a substrate formed by slicing an ingot in a direction parallel to an extensional direction of a linear threading dislocations, thereby allowing reduction in the dislocation density of a principal surface (upper surface).

The aforementioned Japanese Patent Laying-Open No. 2003-133649 discloses a method of manufacturing an ingot having a high dislocation concentrated region having a high dislocation density and a low dislocation region having a low dislocation density due to the concentrated dislocation concentrated region by concentrating the dislocations on a prescribed region when growing a substrate. Japanese Patent Laying-Open No. 2003-133649 also discloses a method of manufacturing a semiconductor device comprising steps of forming the substrate including a dislocation concentrated region extending in a direction perpendicular to a principal surface (upper surface) by slicing the aforementioned ingot in a direction perpendicular to a growth direction of the ingot, providing a semiconductor device layer on the upper surface of the substrate and providing an electrode on a lower surface of the substrate. As described in the aforementioned Japanese Patent Laying-Open No. 2003-133649, this dislocation concentrated region may invert polarity with respect to the low dislocation region. In this case, crystals are not continued on the interface between the dislocation concentrated region and the low dislocation region. Thus, the flow of a current is blocked on the dislocation concentrated region and hence the resistance of the dislocation concentrated region is conceivably increased.

In the conventional substrate described in the aforementioned Japanese Patent Laying-Open No. 2002-29897, however, the linear threading dislocations are dispersed in the overall substrate and hence the dislocation density of the principal surface (upper surface) of the substrate is disadvantageously sufficiently reduced even when the substrate is formed by slicing the ingot in a direction parallel to the extensional direction of the linear threading dislocations.

In the method of manufacturing the conventional semiconductor device described in the aforementioned Japanese Patent Laying-Open No. 2003-133649, the dislocation concentrated region extends in the direction perpendicular to the principal surface (upper surface) of the substrate and the dislocation concentrated region is present on the principal surface (upper surface) of the substrate, and hence the dislocation density of the principal surface (upper surface) of the substrate is disadvantageously increased.

In the case where a substrate is formed by slicing the ingot described in the aforementioned Japanese Patent Laying-Open No. 2003-133649 in the direction parallel to the extensional direction of the dislocation concentrated region, as in the aforementioned Japanese Patent Laying-Open No. 2002-29897, the dislocation density of the principal surface (upper surface) of the substrate can be sufficiently reduced. In this substrate, however, a side of the upper surface and a side of the lower surface of the substrate are parted by the dislocation concentrated region. When driving the semiconductor device, it is required to feed a current between the semiconductor device layer formed on the upper surface of the substrate and the electrode formed on the lower surface of the substrate through the substrate. When a current is fed in the substrate in which the aforementioned sides of the upper and lower surfaces are parted by the dislocation concentrated region, the current must pass through the dislocation concentrated region. In this case, as hereinabove described, the dislocation concentrated region has a high resistance. Thus, in the semiconductor device formed by employing this substrate, the current path of the substrate is disadvantageously increased.

SUMMARY OF THE INVENTION

A method of manufacturing a semiconductor device according to a first aspect of the present invention comprises steps of forming a semiconductor device layer on an upper surface of a substrate including the upper surface, a lower surface and a dislocation concentrated region arranged so as to part a first side closer to the upper surface and a second side closer to the lower surface, exposing a portion where the dislocation concentrated region does not exist above on the lower surface by removing the substrate on the second side along with at least a part of the dislocation concentrated region, and forming an electrode on the portion.

A semiconductor device according to a second aspect of the present invention comprises a substrate including an upper surface, a lower surface and a dislocation concentrated region obliquely extending with respect to the upper surface and arranged so as to part a first side closer to the upper surface and a second side closer to the lower surface, a semiconductor device layer formed on the upper surface, and an electrode formed on a region in the lower surface, exposing at least a portion where the dislocation concentrated region does not exist above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of a semiconductor laser device 1 according to a first embodiment will be now described with reference to FIG. 1.

Figure 1:
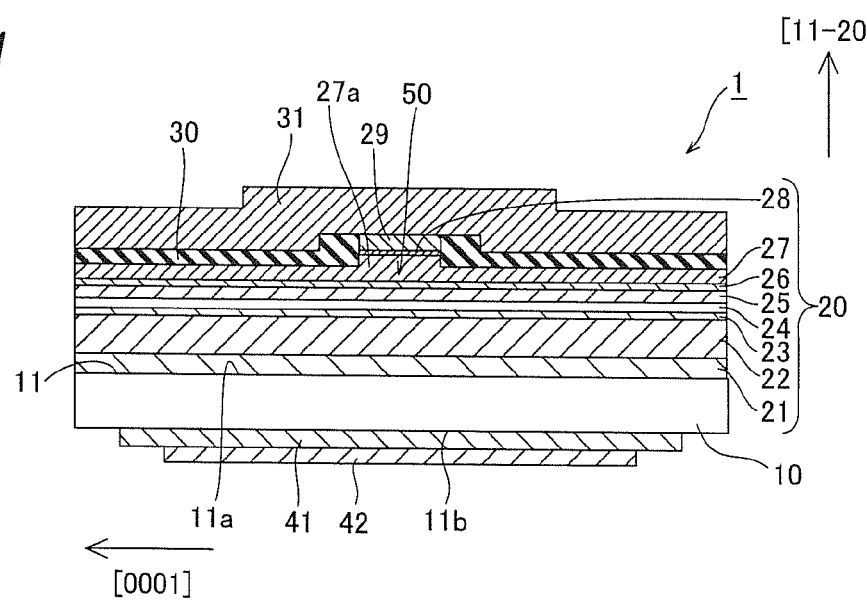
FIG. 1 is a sectional view showing a structure of a semiconductor laser device according to a first embodiment of the present invention, as viewed from a [1-100] direction.

As shown in FIG. 1, the semiconductor laser device 1 according to a first embodiment is a laser device emitting a blue-violet laser having a lasing wavelength of about 405 nm. The semiconductor laser device 1 comprises a substrate 10, a semiconductor layer 20, a p-side ohmic electrode 29, current blocking layers 30, a p-side pad electrode 31, an n-side ohmic electrode 41 and an n-side pad electrode 42. The semiconductor layer 20 is an example of the "semiconductor device layer" or the "semiconductor light-emitting device layer" in the present invention, and the n-side ohmic electrode 41 is an example of the "electrode" in the present invention.

The substrate 10 is made of n-type GaN and has a thickness of about 100 μm. According to the first embodiment, a principal surface 11 (an upper surface 11a and a lower surface 11b) of the substrate 10 is substantially equal to a (11-20) plane. In other words, the upper surface 11a and the lower surface 11b of the substrate 10 are substantially parallel to each other.

The semiconductor layer 20 includes a buffer layer 21 made of $Al_{0.01}Ga_{0.99}N$, having a thickness of about 1.0 μm, an n-side cladding layer 22 made of n-type $Al_{0.07}Ga_{0.93}N$ doped with Ge, having a thickness of about 1.9 μm and formed on the buffer layer 21, an n-side carrier blocking layer 23 made of $Al_{0.2}Ga_{0.8}N$ having a thickness of about 20 nm and formed on the n-side cladding layer 22 and an emission layer 24 formed on the n-side carrier blocking layer 23.

The emission layer 24 has a multiple quantum well (MQW) structure. The emission layer 24 consists of an MQW active layer obtained by alternately stacking three quantum well layers made of $In_xGa_{1-x}N$, each having a thickness of about 2.5 nm and three quantum barrier layers made of $In_yGa_{1-y}N$, each having a thickness of about 20 nm. In this embodiment, x>y, and x=0.15 and y=0.02.

The semiconductor layer 20 further includes a p-side optical guide layer 25 made of $In_{0.01}Ga_{0.99}N$, having a thickness of about 80 nm and formed on the emission layer 24, a p-side carrier blocking layer 26 made of $Al_{0.2}Ga_{0.8}N$, having a thickness of about 20 nm and formed on the p-side optical guide layer 25, a p-side cladding layer 27 made of $Al_{0.07}Ga_{0.93}N$ doped with Mg, having a thickness of about 0.5 μm and formed on the p-side carrier blocking layer 26 and a p-side contact layer 28 made of $In_{0.07}Ga_{0.93}N$, having a thickness of about 3 nm and formed on the p-side cladding layer 27. The p-side cladding layer 27 is provided with a projecting portion 27a having a thickness of about 0.4 μm. The p-side contact layer 28 is formed on the projecting portion 27a of the p-side cladding layer 27. The ridge 50 for forming a waveguide is formed by the projecting portion 27a of the p-side cladding layer 27 and the p-side contact layer 28. The ridge 50 is so formed as to extend in the [1-100] direction (perpendicular to the plane of FIG. 1).

The p-side ohmic electrode 29 is formed on the p-side contact layer 28. The current blocking layers 30 made of $SiO_2$, having a thickness of about 0.2 μm is so formed as to cover an upper surface of the p-side cladding layer 27 and the side surfaces of the ridge 50 and the p-side ohmic electrode 29. The p-side pad electrode 31 is so formed as to cover upper surfaces of the p-side ohmic electrode 29 and the current blocking layers 30. The n-side ohmic electrode 41 and the n-side pad electrode 42 are successively formed on the back surface of the substrate 10 from a side of the substrate 10.

A manufacturing process for the semiconductor laser device 1 according to the first embodiment will be now described with reference to FIGS. 1 to 6.

Figure 2:
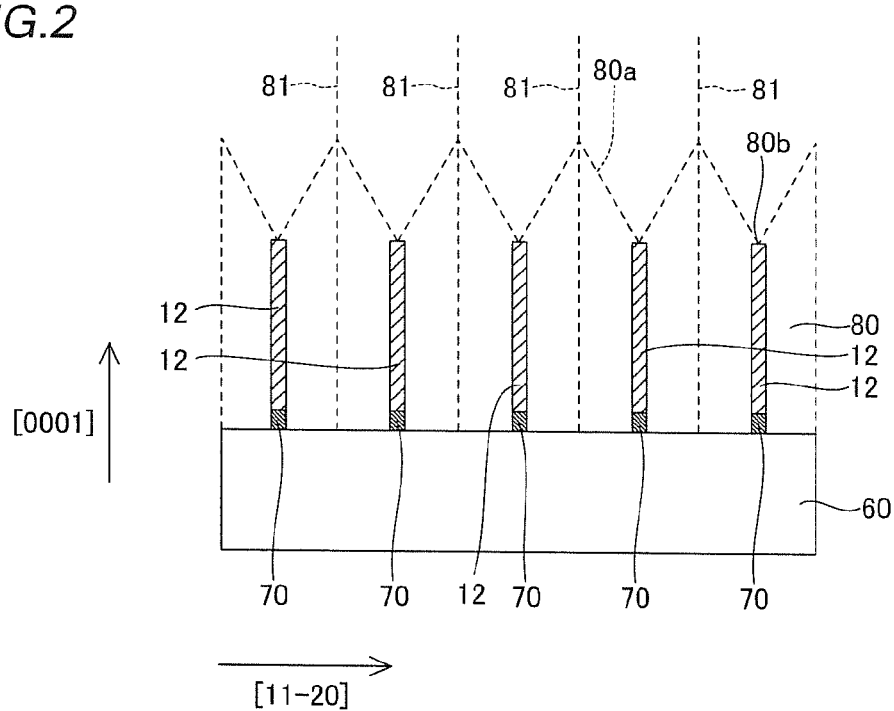
FIG. 2 is a sectional view for illustrating a manufacturing process for a substrate of the semiconductor laser device according to the first embodiment, as viewed from a [1-100] direction.

As a manufacturing process for the substrate 10, amorphous or polycrystalline seeds for generating the dislocation 70 are so formed on a GaAs substrate 60 having a (111) plane as a principal surface as to extend in the [1-100] direction (perpendicular to the plane of FIG. 2) at intervals of about 200 μm in a [11-20] direction, as shown in FIG. 2. Thereafter a GaN layer 80 is grown on the principal surface of the GaAs substrate 60 in a [0001] direction by HVPE (hydride vapor phase epitaxy).

Thus, when the GaN layer 80 is grown, dislocations are formed on the seeds for generating the dislocation 70 and the GaN layer 80 having a saw blade shaped irregular section in which regions on the seeds for generating the dislocation 70 are valleys, is formed, as shown in FIG. 2. Irregular inclined surfaces of the GaN layer 80 (facets 80a) are (11-22) planes. Then, when the growth proceeds in the [0001] direction while maintaining this sectional shape, dislocations existing on the facets 80a moves to valleys 80b. Thus, the dislocation concentrated regions 12 are formed on the seeds for generating the dislocation 70 parallel to the (11-20) plane at intervals of about 200 μm in the [11-20] direction. The GaN layer 80 having the dislocation concentrated regions 12 are formed in the aforementioned manner.

Figure 3:
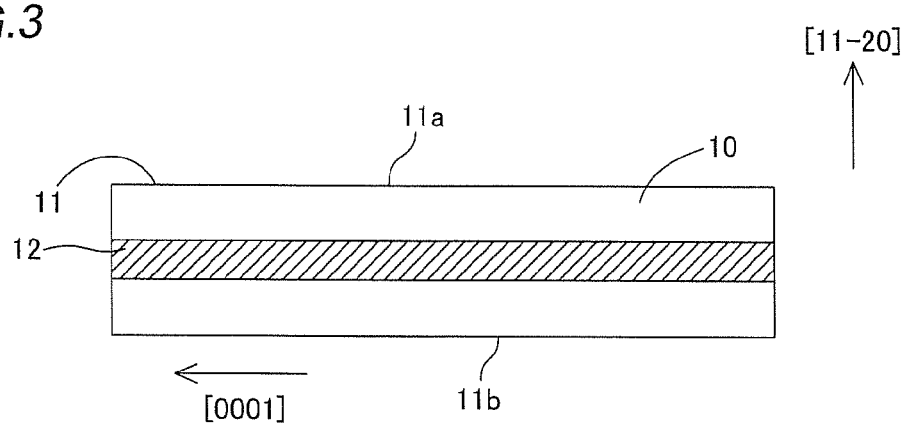
FIGS. 3 to 9 are sectional views for illustrating a manufacturing process for the semiconductor laser device according to the first embodiment, as viewed from a [1-100] direction.

Thereafter the GaAs substrate 60 is removed, and the GaN layer 80 is sliced along a slice plane 81 parallel to the (11-20). Thus, the substrate 10 made of GaN, in which the principal surface 11 is substantially equal to the (11-20) plane and the dislocation concentrated regions 12 are so arranged substantially parallel to the upper surface 11a, is formed, as shown in FIG. 3. The substrate 10 is so formed that the dislocation concentrated region 12 is held between a portion of the GaN layer 80 (see FIG. 2) closer to the upper surface 11a and a portion of the GaN layer 80 closer to the lower surface 11b having dislocation densities lower than that of the dislocation concentrated region 12. Thus, the substrate 10 is so formed that the dislocation concentrated region 12 is not exposed on the upper surface 11a at all. In this state, the substrate 10 has a thickness of about 350 μm. The portion of the GaN layer 80 closer to the upper surface 11a and the portion of the GaN layer 80 closer to the lower surface 11b are examples of the "upper portion" and the "lower portion" in the present invention respectively.

Figure 4:
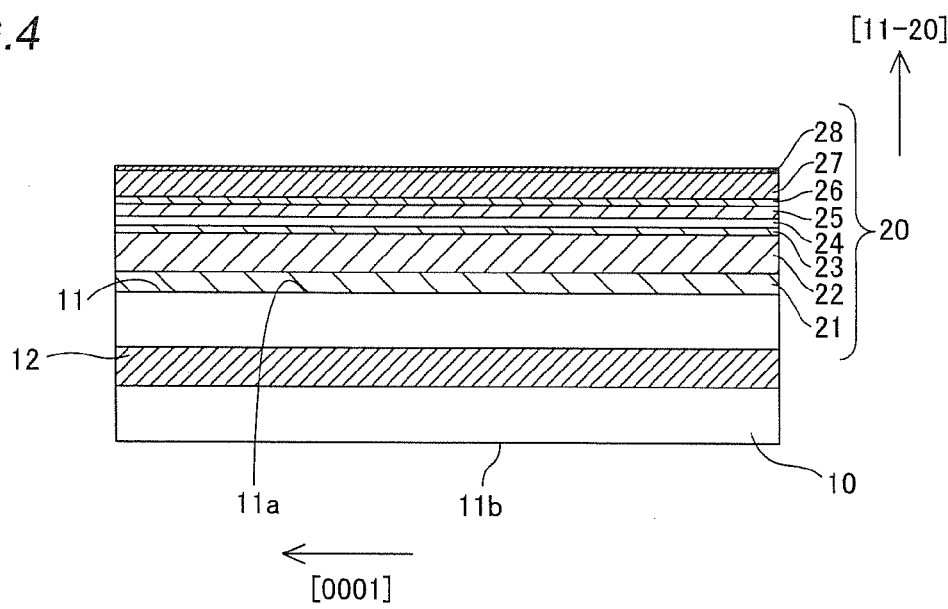

As shown in FIG. 4, the semiconductor layer 20 including the buffer layer 21 (see FIG. 1), the n-side cladding layer 22, the n-side carrier blocking layer 23, the emission layer 24, the p-side optical guide layer 25, the p-side carrier blocking layer 26, the p-side cladding layer 27 and the p-side contact layer 28 is formed on the substrate 10 by MOCVD. More specifically, the substrate 10 is inserted into a reactor of a hydrogen-nitrogen atmosphere, and the substrate 10 is heated up to a temperature of about 1000° C. in the state of supplying $NH_3$ gas employed as a nitrogen source for the semiconductor layer 20. When the substrate 10 reaches the temperature of about 1000° C., hydrogen gas containing trimethylgallium (TMGa) gas and trimethylaluminum (TMAl) gas employed as Ga and Al sources respectively are supplied into the reactor, thereby growing the buffer layer 21 (see FIG. 1) made of $Al_{0.01}Ga_{0.99}N$ with a thickness of about 1.0 μm on the substrate 10.

Then, hydrogen gas containing TMGa gas and TMAl gas and monogerman gas ($GeH_4$) employed as a Ge source for obtaining an n-type conductivity are supplied into the reactor, thereby growing the n-side cladding layer 22 (see FIG. 1) made of $Al_{0.07}Ga_{0.93}N$ having a thickness of about 1.9 μm. Thereafter hydrogen gas containing TMGa and TMAl is supplied into the reactor, thereby growing the n-side carrier blocking layer 23 (see FIG. 1) made of $Al_{0.2}Ga_{0.8}N$ with a thickness of about 20 nm.

The temperature of the substrate 10 is reduced to about 850° C. and triethylgallium (TEGa) gas and trimethylindium (TMIn) gas employed as Ga and In sources respectively are supplied in a nitrogen atmosphere supplied with $NH_3$ while changing the flow rates thereof. Thus, the emission layer 24 (see FIG. 1) made of an MQW active layer having a multiple quantum well structure obtained by alternately stacking the three quantum well layers made of $In_xGa_{1-y}N$ and the three quantum barrier layers made of $In_yGa_{1-y}N$ is formed. Thereafter TMGa and TMAl are supplied into the reactor, thereby successively growing the p-side optical guide layer 25 made of $In_{0.01}Ga_{0.99}N$ having a thickness of about 80 nm and the p-side carrier blocking layer 26 (see FIG. 1) made of $Al_{0.25}Ga_{0.75}N$ having a thickness of about 20 nm on the upper surface of the emission layer 24.

In a hydrogen-nitrogen atmosphere supplied with $NH_3$ gas, the temperature of the substrate is heated up to a temperature of about 1000° C. and cyclopentadienyl magnesium (Mg ($C_5H_5)_2$) employed as an Mg source serving as a p-type impurity and TMGa gas and TMAl gas are supplied into the reactor, thereby growing the p-side cladding layer 27 (see FIG. 1) made of $Al_{0.07}Ga_{0.93}N$ with a thickness of about 0.45 μm. Then the temperature of the substrate is reduced to about 850° C. and TEGa gas and TMIn gas are supplied in a nitrogen atmosphere supplied with $NH_3$, thereby forming the p-side contact layer 28 (see FIG. 1) made of $In_{0.07}Ga_{0.93}N$. The semiconductor layer 20 is grown on the substrate 10 made of GaN by MOCVD in the aforementioned manner.

Thereafter the temperature of the substrate is reduced to the room temperature and the substrate 10 stacked with the semiconductor layer 20 is taken out from the reactor.

Figure 5:
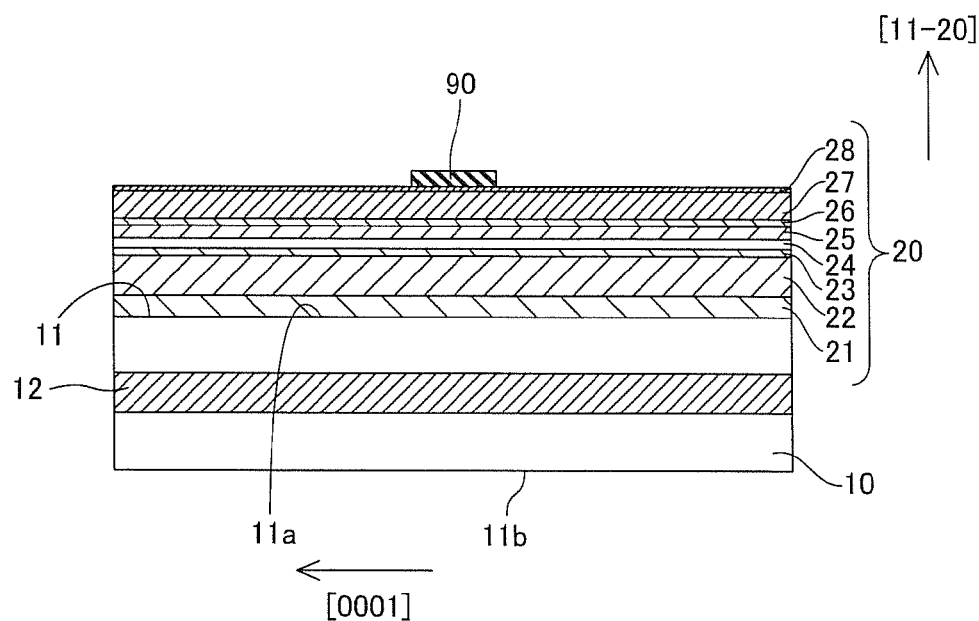
Figure 6:
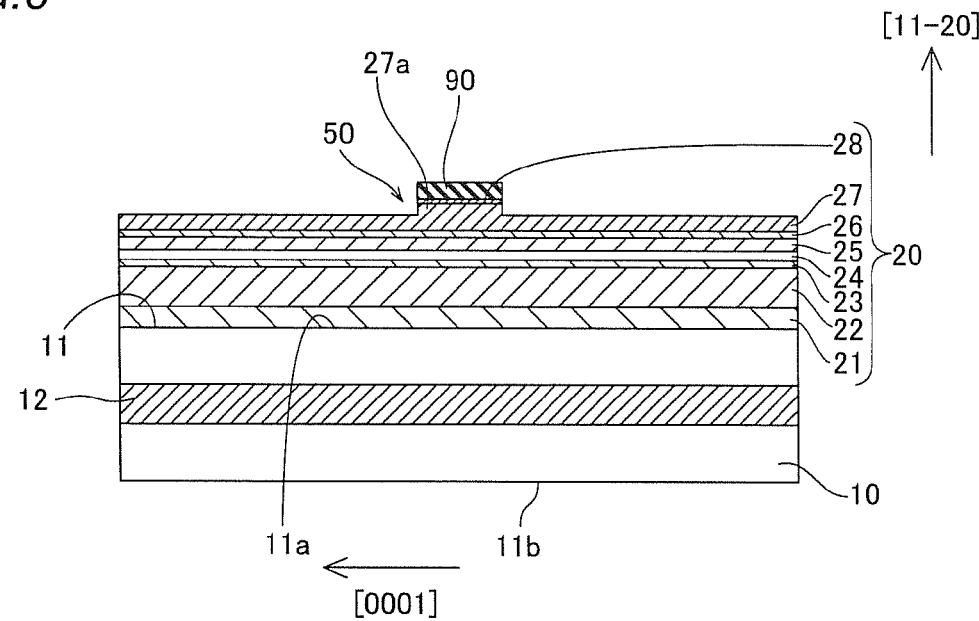

As shown in FIG. 5, a mask 90 made of $SiO_2$ is formed on an upper surface of the semiconductor layer 20 (p-side contact layer 28) to extend in the [1-100] direction. $SiO_2$ is employed as a mask for partially patterning the p-side contact layer 28 and the p-side cladding layer 27 by RIE (reactive ion etching) employing $Cl_2$ gas, thereby forming the ridges 50 for forming the waveguides, as shown in FIG. 6. In this etching, the p-side contact layer 28 is patterned for remaining a thickness of about 0.05 μm in each p-side cladding layer 27 (see FIG. 1) having a thickness of about 0.45 μm, thereby forming the projecting portions 27a of the p-side cladding layer 27. Thus, the ridges 50 including the projecting portions 27a of the p-side cladding layer 27 and the p-side contact layers 28 are formed. The ridges 50 are formed parallel to each other so as to extend in the [1-100] direction (perpendicular to the plane of FIG. 1).

Figure 7:
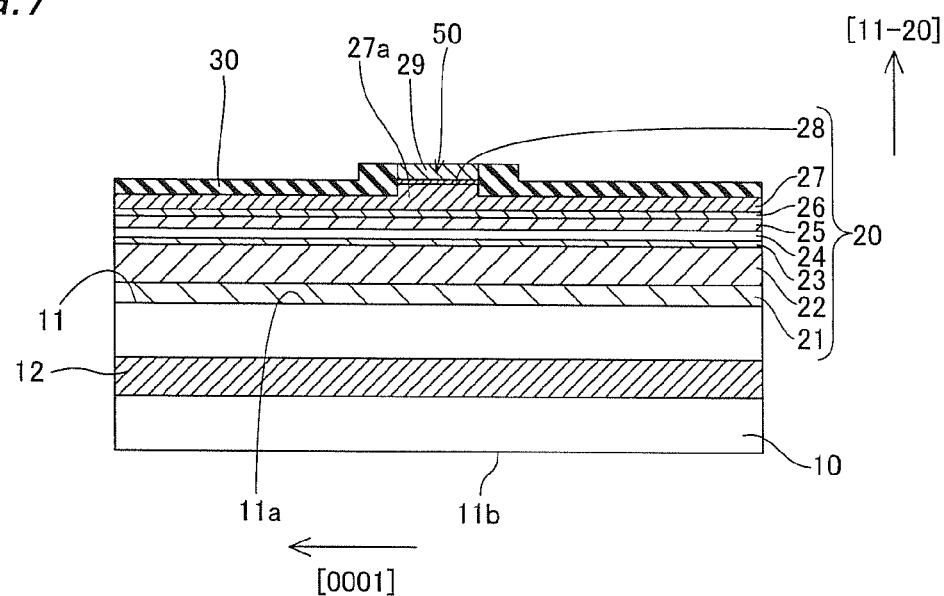
Figure 8:
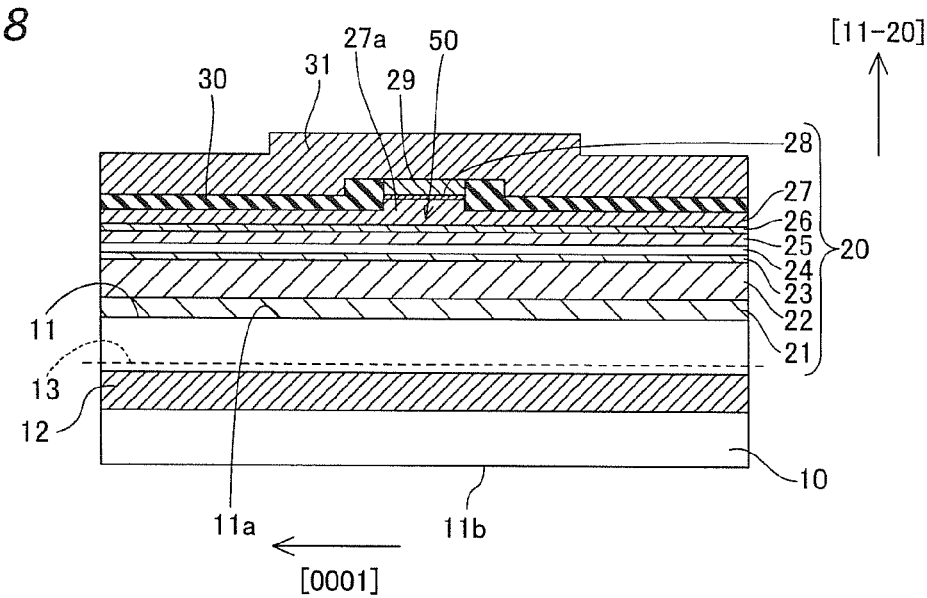

Thereafter the mask 90 is removed and the p-side ohmic electrode 29 is formed on the p-side contact layer 28 located on upper surfaces of the ridges 50. As shown in FIG. 7, the current blocking layers 30 (see FIG. 1) made of $SiO_2$ are so formed as to cover the upper surfaces of the p-side cladding layer 27 and the side surfaces of the ridges 50 and the p-side ohmic electrodes 29. Thereafter the p-side pad electrode 31 (see FIG. 1) is formed to cover the upper surfaces of the p-side ohmic electrodes 29 and the current blocking layers 30, as shown in FIG. 8.

Figure 9:
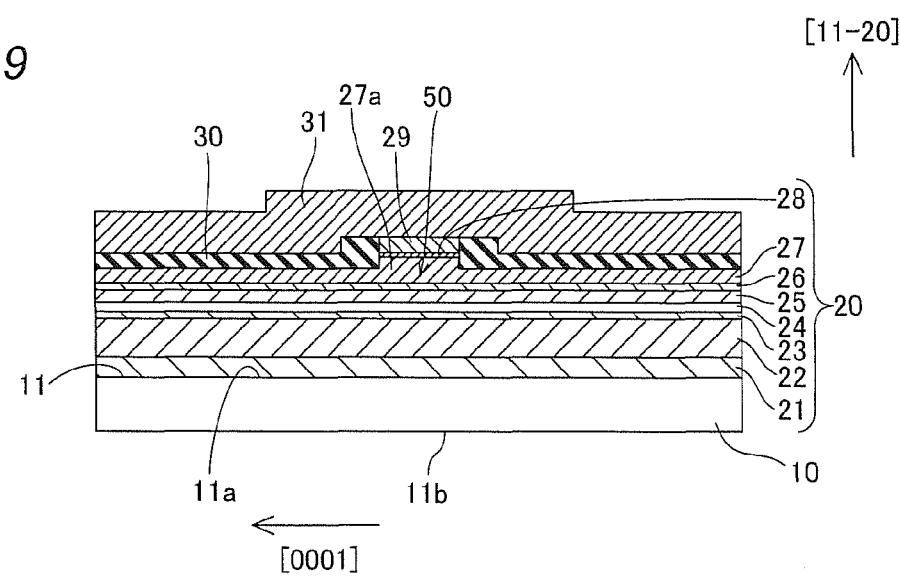

Thereafter the lower surface 11b of the substrate 10 is polished up to a thickness allowing easy cleavage (about 100 μm), as shown in FIG. 9. More specifically, all of the GaN layer 80 (see FIG. 2) from the lower surface 11b (see FIG. 8) of the substrate 10, the dislocation concentrated region 12 and a part of the GaN layer 80 closer to the upper surface 11a (region up to a broken line 13 in FIG. 8) are successively polished. Thus, all of the dislocation concentrated regions 12 are removed and a portion where the dislocation concentrated region 12 does not exist above the lower surface 11b is exposed on the lower surface 11b. Thereafter the n-side ohmic electrode 41 and the n-side pad electrode 42 (see FIG. 1) are successively formed on the lower surface 11b of the substrate 10 where the dislocation concentrated region 12 does not exist, as shown in FIG. 1.

Although not shown, cleavage is performed parallel to a (1-100) plane for forming cavity facets and facet coating films (not shown) are formed on both facets (both cavity facets). Thereafter singulation process is performed by dividing the devices parallel to the (11-20) plane on positions separated in a direction perpendicular to the extensional direction of each ridge 50 (perpendicular to the plane of FIG. 1) from each ridge 50 by prescribed distances. According to the first embodiment, the semiconductor laser device 1 (see FIG. 1) is manufactured in the aforementioned manner.

According to the first embodiment, as hereinabove described, the substrate 10 in which the dislocation concentrated region 12 is so arranged as to extend substantially parallel to the upper surface 11a and the lower surface 11b is formed, whereby the dislocation concentrated region 12 can be inhibited from being exposed on the upper surface 11a of the substrate 10. The lower surface 11b of the substrate 10 is so removed as to remove all of the dislocation concentrated region 12, whereby the portion where the dislocation concentrated region 12 does not exist above the lower surface 11b is exposed on the lower surface 11b and hence all of the dislocation concentrated region 12 can be removed from the substrate 10. Thus, a current path allowing flow of a current without passing through the dislocation concentrated region 12 can be provided between the upper surface 11a and the lower surface 11b. This current path has a low resistance as compared with a case where a current flows through the dislocation concentrated region 12, and hence increase in the resistance of the current path of the substrate 10 can be suppressed.

According to the first embodiment, the upper surface 11a of the substrate 10 is a plane substantially equal to the (11-20) plane, whereby the semiconductor layer 20 can be formed on the (11-20) plane employed as a nonpolar plane inclined by about 90 degrees with respect to the (0001) plane when forming the semiconductor layer 20 on the upper surface 11a of the substrate 10. In the semiconductor laser device 1 employing the substrate 10 having the upper surface 11a as the nonpolar plane, a piezoelectric field can be suppressed.

According to the first embodiment, the semiconductor layer 20 is made of a nitride-based semiconductor of AlGaN or InGaN, whereby the semiconductor laser device 1 comprising the substrate 10 having a low dislocation density and made of a blue-violet semiconductor laser suppressing increase in the resistance of the current path can be formed.

Second Embodiment

Figure 10:
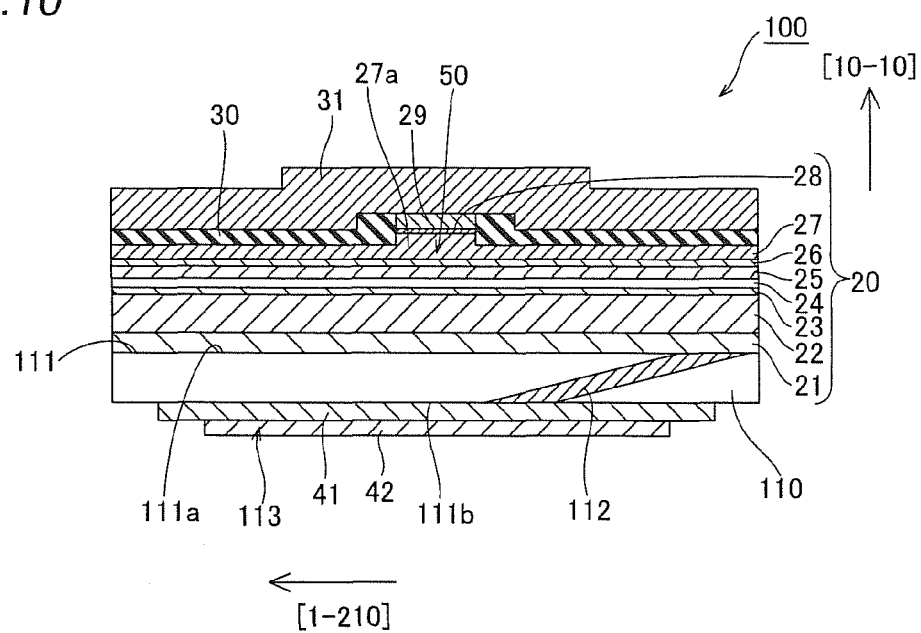
FIG. 10 is a sectional view showing a structure of a semiconductor laser device according to a second embodiment of the present invention, as viewed from a [0001] direction.

Referring to FIG. 10, a semiconductor laser device 100 employing a substrate 110 having a dislocation concentrated region 112 so formed as to obliquely extend with respect to an upper surface 11a is manufactured in a second embodiment, dissimilarly to the aforementioned first embodiment.

As shown in FIG. 10, the semiconductor laser device 100 according to the second embodiment comprises the substrate 110, a semiconductor layer 20, a p-side ohmic electrode 29, current blocking layers 30, a p-side pad electrode 31, an n-side ohmic electrode 41 and an n-side pad electrode 42.

The substrate 110 is made of n-type GaN and has a thickness of about 100 μm.

According to the second embodiment, a principal surface 111 of the substrate 110 (an upper surface 111a and a lower surface 111b) has a (10-10) plane inclined by about 30 degrees with respect to a (11-20) plane. In the substrate 110, the planar dislocation concentrated region 112 is so arranged as to extend parallel to the (11-20) plane. The dislocation concentrated region 112 is inclined by about 30 degrees with respect to the upper surface 111a of the substrate 110. The dislocation concentrated region 112 has a crystal structure with a large number of crystal defects and discontinuous with crystal portions therearound, and hence has a high resistance value.

According to the second embodiment, the dislocation concentrated region 112 is so arranged in the substrate 110 as to obliquely extend from the upper surface 111a to the lower surface 111b of the substrate 110, as shown in FIG. 10. Therefore, the substrate 110 has a region (dislocation concentrated region 112) completely blocked from the upper surface 111a to the lower surface 111b along a thickness direction of the substrate 110 by the dislocation concentrated region 112.

According to the second embodiment, the ridge 50 for forming a waveguide is formed above a region except a portion where the dislocation concentrated region 112 is present in the upper surface 111a of the substrate 110, as shown in FIG. 10. This ridge 50 is so formed as to extend in a [0001] direction (perpendicular to the plane of FIG. 10). The ridge 50 is formed above a region except a portion where the dislocation concentrated region 112 is present in the lower surface 111b of the substrate 110. Therefore, this substrate 110 is so formed that a current can flow from the upper surface 111a to the lower surface 111b along a current path (region except the dislocation concentrated region 112) formed by a low resistance region with a resistance value lower than that of the dislocation concentrated region 112, while avoiding the dislocation concentrated region 112 with a high resistance.

The n-side ohmic electrode 41 is provided on a substantially overall region including a region 113 in the lower surface 111b of the substrate 110, exposing the portion where the dislocation concentrated region 112 does not exist above the lower surface 111b.

A manufacturing process for the semiconductor laser device 100 according to the second embodiment will be now described with reference to FIGS. 2, 11 to 15.

As a manufacturing process for the substrate 110, the GaN layer 80 (see FIG. 2) having the dislocation concentrated region 12 is formed similarly to the aforementioned first embodiment.

Figure 11:
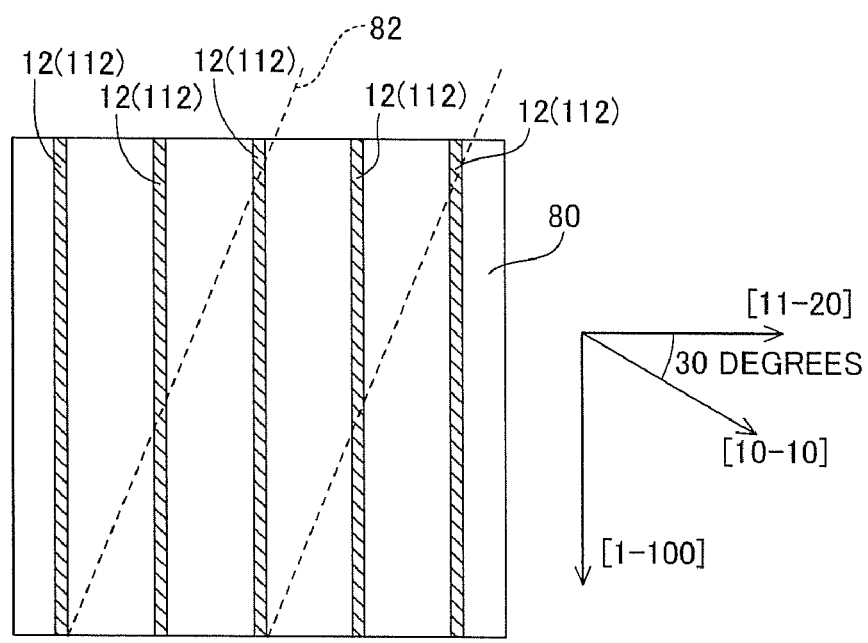
FIG. 11 is a plan view for illustrating a manufacturing process for a substrate of the semiconductor laser device according to the second embodiment, as viewed from the [0001] direction.
Figure 12:
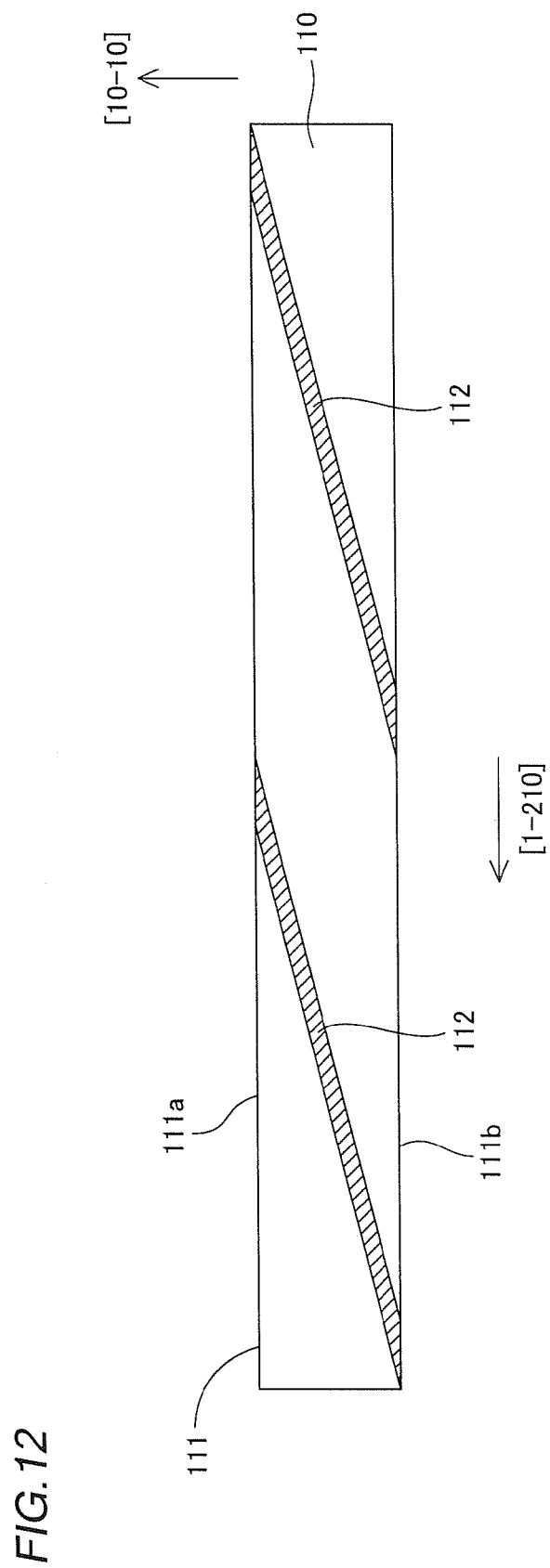
FIGS. 12 to 15 are sectional views for illustrating a manufacturing process for the semiconductor laser device according to the second embodiment, as viewed from the [0001] direction.

Thereafter the GaAs substrate 60 (see FIG. 2) is removed and the GaN layer 80 is sliced along a slice plane 82 parallel to the (10-10) plane inclined from the (11-20) plane in a [1-100] direction by about 30 degrees, as shown in FIG. 11. Thus, the substrate 110, in which the principal surface 111 (the upper surface 111a and the lower surface 111b) is substantially equal to the (10-10) plane and the dislocation concentrated regions 112 are so arranged as to obliquely extend with respect to the principal surface 111, is formed, as shown in FIG. 12. The substrate 110 has a thickness of about 350 μm in this state.

Figure 13:
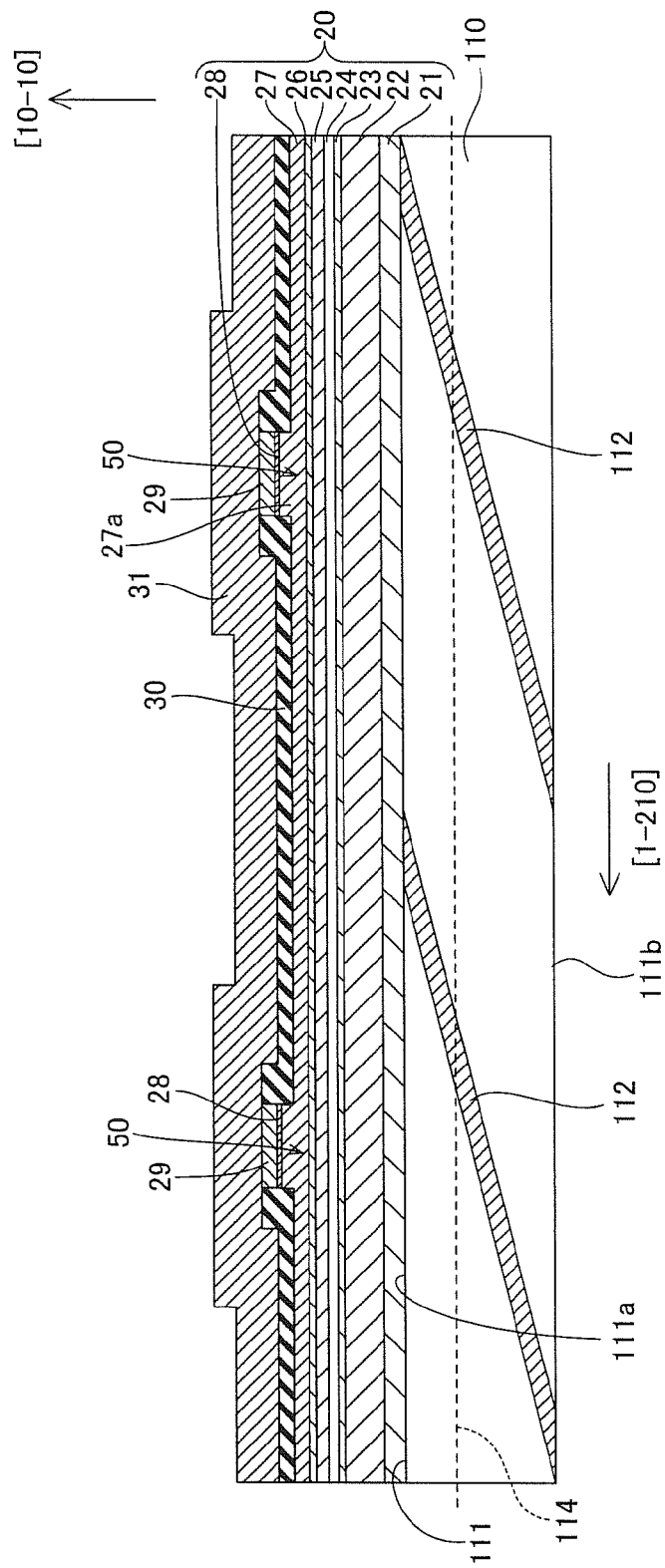

As shown in FIG. 13, the semiconductor layer 20 including a buffer layer 21, an n-side cladding layer 22, an n-side carrier blocking layer 23, an emission layer 24, a p-side optical guide layer 25, a p-side carrier blocking layer 26, a p-side cladding layer 27 and a p-side contact layer 28 is formed on the upper surface 111a of the substrate 110 by MOCVD through a fabricating process similar to the aforementioned first embodiment. Thereafter the ridges 50 for forming waveguides are so formed as to extend in the [0001] direction (perpendicular to the plane of FIG. 10).

According to the second embodiment, the ridges 50 are so formed as to be arranged above the regions except the portions where the dislocation concentrated regions 112 are present in the upper surface 111a of the substrate 110.

Thereafter the p-side ohmic electrodes 29, the current blocking layers 30 and the p-side pad electrode 31 are successively formed.

Figure 14:
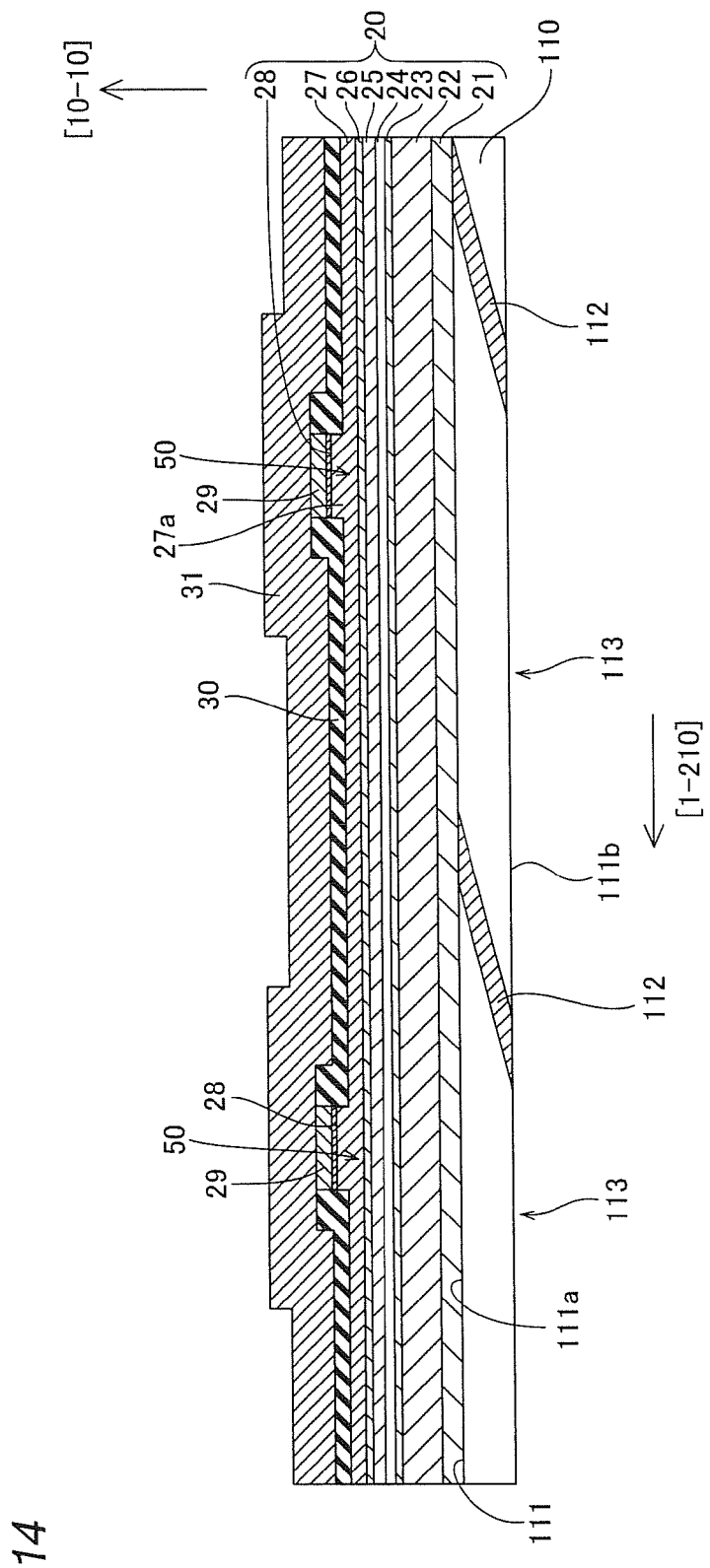

As shown in FIG. 14, the lower surface 111b of the substrate 110 is polished up to a thickness allowing easy cleavage (about 100 μm) (up to a broken line 114 in FIG. 13). At this time, the substrate 110 is so polished that the ridges 50 are arranged above the regions except the portions where the dislocation concentrated regions 112 are present in the lower surface 111b of the substrate 110 according to the second embodiment. Thus, the dislocation concentrated regions 112 are partially removed and the portions where the dislocation concentrated regions 112 do not exist above the lower surface 111b are exposed on the lower surface 111b.

Figure 15:
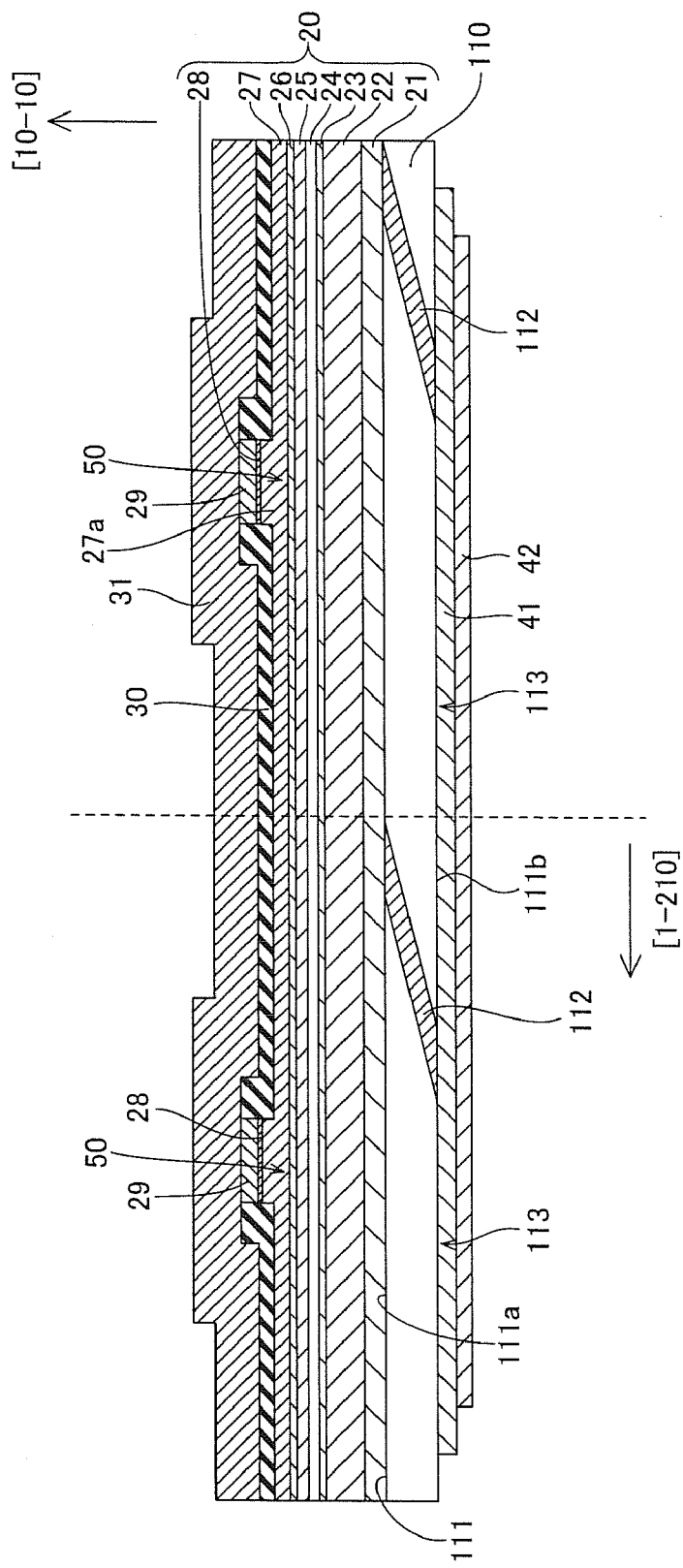

The n-side ohmic electrode 41 and the n-side pad electrode 42 are successively formed on the substantially overall region including the regions 113 in the lower surface 111b of the substrate 110, exposing the portions where the dislocation concentrated regions 112 do not exist above on the lower surface 111b as shown in FIG. 15.

Although not shown, cavity facets are formed by performing cleavage parallel to a (0001) plane and facet coating films (not shown) are formed on both facets (both cavity facets). Thereafter singulation process is performed by dividing the devices on positions (dotted line in FIG. 15) separated in a direction perpendicular to the extensional direction of each ridge 50 (perpendicular to the plane of FIG. 10) from each ridge 50 by prescribed distances. According to the second embodiment, the semiconductor laser device 100 is manufactured in the aforementioned manner.

According to the second embodiment, as hereinabove described, the substrate 110, in which the dislocation concentrated region 112 is so arranged as to extend in the direction inclined by about 30 degrees with respect to the upper surface 111a, is formed, whereby the area where the dislocation concentrated region 112 is exposed on the upper surface 111a of the substrate 110 can be reduced as compared with a substrate (not shown) where a dislocation concentrated region is so arranged as to extend in a direction perpendicular to an upper surface. The portion where the dislocation concentrated region 112 does not exist above the lower surface 111b is exposed on the lower surface 111b by removing the lower surface 111b of the substrate 110, whereby a current path allowing flow of a current without passing through the dislocation concentrated region 112 can be provided between the upper surface 111a and the lower surface 111b (region 113 exposing the portion where the dislocation concentrated region 112 does not exist above the lower surface 111b). This current path has a low resistance as compared with a case where a current flows through the dislocation concentrated region 112, and hence increase in the resistance of the current path of the substrate 110 can be suppressed.

According to the second embodiment, the dislocation concentrated region 112 is so arranged as to obliquely extend from the upper surface 111a to the lower surface 111b of the substrate 110, whereby the substrate 110 has the region (dislocation concentrated region 112) completely blocked from the upper surface 111a to the lower surface 111b of the substrate 110 along the thickness direction of the substrate 110 by the dislocation concentrated region 112 and hence the dislocation concentrated region 112 can reliably absorb light leaking from the n-side cladding layer 22 below the ridge 50 to the side of the substrate 110.

According to the second embodiment, the ridge 50 is so formed as to be located above the region 112 except the portion where the dislocation concentrated region 112 is present in the upper surface 111a of the substrate 110, whereby the waveguide formed on a lower domain of the ridge 50 can be reliably arranged on the upper surface 111a except the portion where the dislocation concentrated region 112 is present. The ridge 50 is so formed as to be located above the region except the portion where the dislocation concentrated region 112 is present in the lower surface 111b of the substrate 110, whereby the waveguide can be reliably arranged above the lower surface 111b except the portion where the dislocation concentrated region 112 is present. Consequently, a current can flow while avoiding the dislocation concentrated region 112 having the high resistance and hence increase in the resistance of the current path can be suppressed.

According to the second embodiment, the upper surface 111a of the substrate 110 is substantially equal to the (10-10) plane, whereby the semiconductor layer 20 can be formed on the (10-10) plane employed as a nonpolar plane inclined by about 90 degrees with respect to the (0001) plane when forming the semiconductor layer 20 on the upper surface 111a of the substrate 110. In the semiconductor laser device 100 employing the substrate 110 having the upper surface 111a as the nonpolar plane, a piezoelectric field can be suppressed.

Third Embodiment

Figure 16:
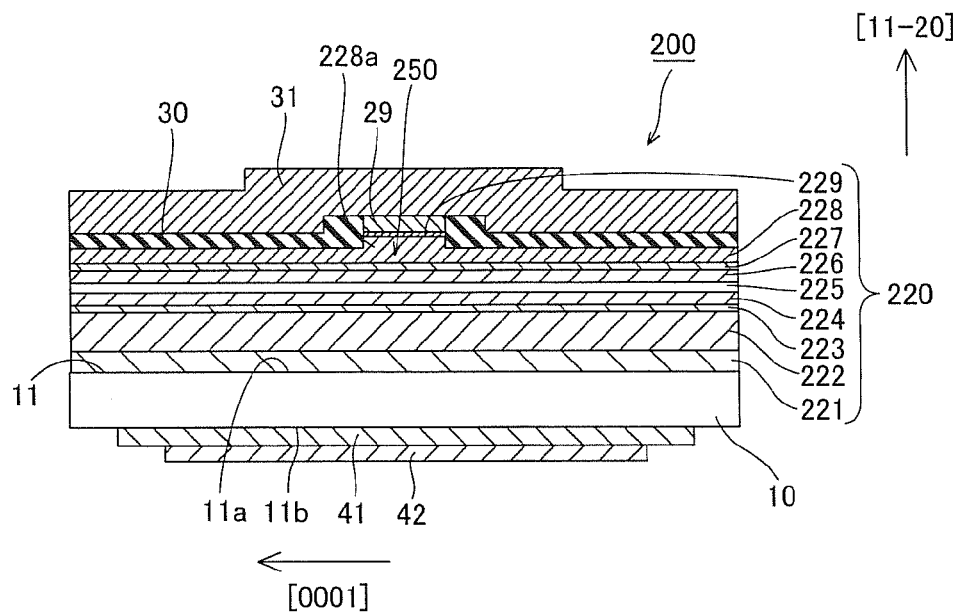
FIG. 16 is a sectional view showing a structure of a semiconductor laser device according to a third embodiment, as viewed from a [1-100] direction.

Referring to FIG. 16, a semiconductor laser device 200 emitting a green laser is manufactured in a third embodiment, dissimilarly to the aforementioned first embodiment in which the semiconductor laser device 1 emitting a (blue-violet) laser having a wavelength of 405 nm is manufactured.

As shown in FIG. 16, the semiconductor laser device 200 according to the third embodiment comprises a substrate 10, a semiconductor layer 220, a p-side ohmic electrode 29, current blocking layers 30, a p-side pad electrode 31, an n-side ohmic electrode 41 and an n-side pad electrode 42. The semiconductor layer 220 is an example of the "semiconductor device layer" or the "semiconductor light-emitting device" in the present invention.

The semiconductor layer 220 according to the third embodiment has a composition different from that of the semiconductor layer 20 according to each of the aforementioned first and second embodiments and provided with an n-side optical guide layer 224. More specifically, the semiconductor layer 220 includes a buffer layer 221 made of $Al_{0.01}Ga_{0.99}N$, formed on an upper surface 11a of the substrate 10, an n-side cladding layer 222 made of n-side $Al_{0.03}Ga_{0.97}N$ doped with Ge, formed on the buffer layer 221, an n-side carrier blocking layer 223 made of $Al_{0.1}Ga_{0.9}N$, formed on the n-side cladding layer 222, an n-side optical guide layer 224 made of $In_{0.05}Ga_{0.95}N$, formed on the n-side carrier blocking layer 223 and an emission layer 225 formed on the n-side optical guide layer 224. The semiconductor layer 220 further includes a p-side optical guide layer 226 made of $In_{0.05}Ga_{0.95}N$, formed on the emission layer 225, a p-side carrier blocking layer 227 made of $Al_{0.1}Ga_{0.9}N$, formed on the p-side optical guide layer 226, a p-side cladding layer 228 made of $Al_{0.03}Ga_{0.97}N$, formed on the p-side carrier blocking layer 227 and a p-side contact layer 229 made of $In_{0.07}Ga_{0.93}N$, formed on the p-side cladding layer 228. The emission layer 225 is made of an MQW active layer obtained by alternately stacking two quantum well layers made of $In_xGa_{1-x}N$, each having a thickness of about 2.5 nm and three quantum barrier layers made of $In_yGa_{1-y}N$, each having a thickness of about 20 nm. In this embodiment, x>y, and x=0.55 and y=0.25. According to this structure, the semiconductor layer 220 emits a green laser.

The p-side cladding layer 228 is provided with a projecting portion 228a having a thickness of about 0.4 μm. The p-side contact layer 229 is formed on the projecting portion 228a of the p-side cladding layer 228. The projecting portion 228a of the p-side cladding layer 228 and the p-side contact layer 229 form a ridge 250 for forming a waveguide. The ridge 250 is so formed as to extend in a [1-100] direction (perpendicular to the plane of FIG. 16).

The manufacturing process for the semiconductor laser device 200 is similar to that for the semiconductor laser device 1 according to the aforementioned first embodiment except that the semiconductor layer 220 is formed in the place of the semiconductor layer 20, and hence redundant detailed description is omitted.

The remaining effects of the third embodiment are similar to those of the aforementioned first embodiment.

Fourth Embodiment

Figure 17:
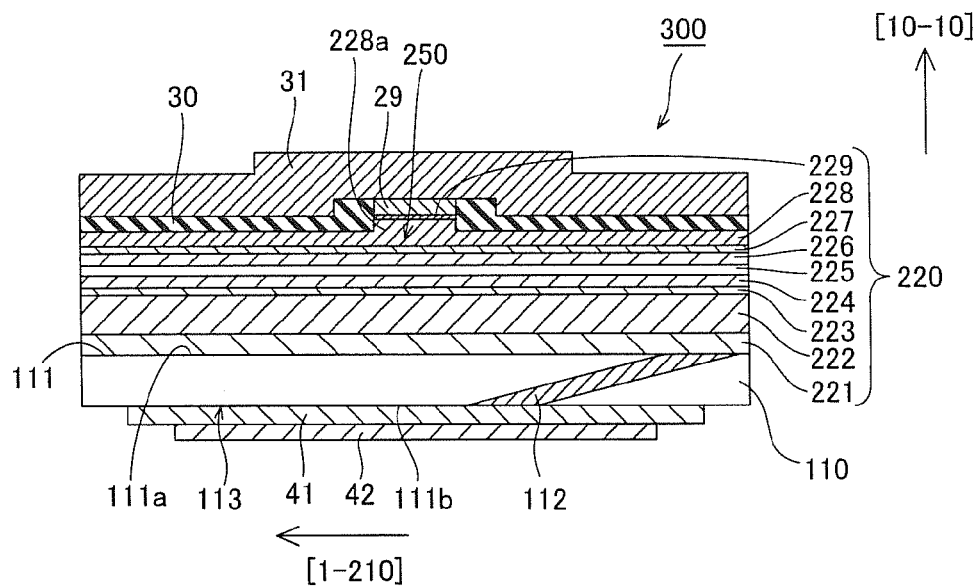
FIG. 17 is a sectional view showing a structure of a semiconductor laser device according to a fourth embodiment, as viewed from a [0001] direction.

Referring to FIG. 17, a semiconductor laser device 300 emitting a green laser is manufactured in a fourth embodiment, dissimilarly to the aforementioned second embodiment in which the semiconductor laser device 100 emitting a (blue-violet) laser having a wavelength of 405 nm is manufactured.

As shown in FIG. 17, a semiconductor laser device 300 according to the fourth embodiment comprises a substrate 110, a semiconductor layer 220, a p-side ohmic electrode 29, current blocking layers 30, a p-side pad electrode 31, an n-side ohmic electrode 41 and an n-side pad electrode 42. In other words, the semiconductor layer 220 according to the aforementioned third embodiment is formed on the substrate 110 according to the aforementioned second embodiment.

The manufacturing process for the semiconductor laser device 300 is similar to that for the semiconductor laser device 100 according to the aforementioned second embodiment except that the semiconductor layer 220 is formed in the place of the semiconductor layer 20, and hence redundant detailed description is omitted.

The remaining effects of the fourth embodiment are similar to those of the aforementioned second embodiment.

Fifth Embodiment

Figure 18:
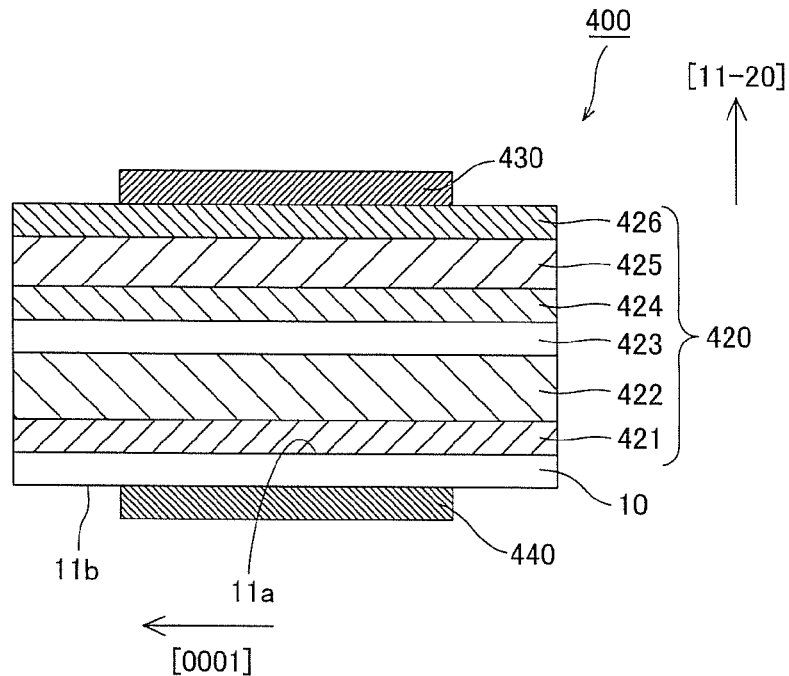
FIG. 18 is a sectional view showing a structure of a LED device according to a fifth embodiment, as viewed from a [1-100] direction.

Referring to FIG. 18, a LED device 400 emitting blue-violet light is manufactured in a fifth embodiment, dissimilarly to the aforementioned first embodiment in which the semiconductor laser device 1 emitting a (blue-violet) laser having a wavelength of 405 nm is manufactured.

As shown in FIG. 18, the LED device 400 according to the fifth embodiment is a light-emitting device emitting blue-violet light, and comprises a substrate 10 according to the aforementioned first embodiment, a semiconductor layer 420, a p-side electrode 430 made of NiAu and an n-side electrode 440 made of NiAl. The semiconductor layer 420 is an example of the "semiconductor device layer" and the "semiconductor light-emitting device layer" in the present invention, and the n-side electrode 440 is an example of the "electrode" in the present invention.

The semiconductor layer 420 includes a buffer layer 421 made of n-type GaN doped with Si, having a thickness of about 0.5 μm and formed on an upper surface 11a of the substrate 10, an n-side cladding layer 422 made of $Al_{0.07}Ga_{0.93}N$ doped with Si, having a thickness of about 0.15 μm and formed on the buffer layer 421, an active layer 423 formed on the n-side cladding layer 422, a cap layer 424 made of $Al_{0.2}Ga_{0.8}N$ doped with Mg, having a thickness of about 20 nm and formed on the active layer 423, a p-side cladding layer 425 made of $Al_{0.07}Ga_{0.93}N$ doped with Mg, having a thickness of about 0.2 μm and formed on the cap layer 424 and a contact layer 426 made of $In_{0.05}Ga_{0.95}N$ doped with Mg, having a thickness of about 5 nm and formed on the p-side cladding layer 425. The active layer 423 is an example of the "emission layer" in the present invention.

The active layer 423 has a multiple quantum well (MQW) structure. The active layer 423 consists of an MQW active layer obtained by alternately stacking three quantum well layers made of $In_{0.1}Ga_{0.9}N$, each having a thickness of about 3 nm and three quantum barrier layers made of GaN, each having a thickness of about 20 nm.

The p-side electrode 430 is formed on the contact layer 426. The n-side electrode 440 is formed on a lower surface 11b of the substrate 10.

A manufacturing process for the LED device 400 according to the fifth embodiment will be now described with reference to FIGS. 2, 3, 18 and 19.

A GaN layer 80 shown in FIG. 2 is sliced along a slice plane 81, thereby forming the substrate 10 shown in FIG. 3.

Figure 19:
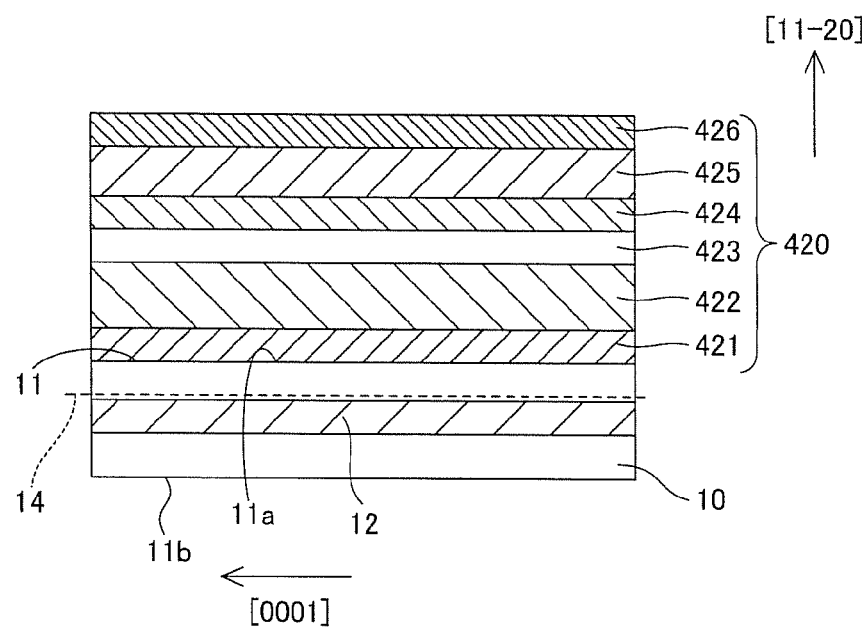
FIG. 19 is a sectional view for illustrating a manufacturing process for the LED device according to a fifth embodiment, as viewed from the [1-100] direction.

As shown in FIG. 19, the semiconductor layer 420 including the buffer layer 421 (see FIG. 1), the n-side cladding layer 422, the active layer 423, the p-side cap layer 424, the p-side cladding layer 425 and the contact layer 426 is formed on the substrate 10 by MOCVD.

More specifically, the buffer layer 421 made of single-crystalline Si-doped GaN, having a thickness of about 0.5 μm is grown on the substrate 10 with source gas of $NH_3$ and TMGa and dopant gas of $SiH_4$ while heating the substrate 10 to a growth temperature of about 1000° C. to 1200° C. (1150° C., for example).

The n-side cladding layer 422 made of single-crystalline Si-doped $Al_{0.07}Ga_{0.93}N$, having a thickness of about 0.15 μm is grown on the buffer layer 421 with source gas of $NH_3$, TMGa and TMAl and dopant gas of $SiH_4$.

The well layers made of single-crystalline $In_{0.1}Ga_{0.9}N$, each having a thickness of about 3 nm and the three quantum barrier layers made of GaN, each having a thickness of about 20 nm are alternately grown on the n-side cladding layer 422 with source gas of $NH_3$, TMGa and TMIn while holding the substrate 10 at a growth temperature of about 700° C. to about 1000° C. (about 850° C., for example), thereby growing the active layer 423 of the MQW structure including the three quantum well layers.

Then, the cap layer 424 made of single-crystalline $Al_{0.2}Ga_{0.8}N$ doped with Mg having a thickness of about 20 nm is grown while changing the source gas to that of $NH_3$, TMGa and TMAl with addition of dopant gas of $Cp_2Mg$.

The p-type cladding layer 425 made of single-crystalline Mg-doped $Al_{0.07}Ga_{0.93}N$ having a thickness of about 0.2 μm is grown on the cap layer 424 with source gas of $NH_3$, TMGa and TMAl and dopant gas of $Cp_2Mg$ while heating the substrate 10 to a growth temperature of about 1000° C. to about 1200° C. (about 1150° C., for example).

The contact layer 426 made of single-crystalline Mg-doped $In_{0.05}Ga_{0.95}N$ having a thickness of about 5 nm is grown on the p-side cladding layer 425 with source gas of $NH_3$, TMGa and TMIn and dopant gas of $Cp_2Mg$ while holding the substrate 10 at a growth temperature of about 700° C. to about 1000° C. (about 850° C., for example).

The semiconductor layer 420 is formed in the aforementioned manner.

Thereafter the p-side electrode 430 made of NiAu is formed on the contact layer 426 by vacuum evaporation. As shown in FIG. 19, the lower surface 11b of the substrate 10 is polished up to a dotted line 14 in FIG. 19. Thus, a substantially overall dislocation concentrated region 12 is removed and a portion where the dislocation concentrated region 12 does not exist above the lower surface 11b is exposed on the lower surface 11b. Thereafter the n-side electrode 440 made of NiAl is formed on the lower surface 11b. Finally, the LED device 400 shown in FIG. 18 is manufactured by separating devices by dicing.

The effects of the fifth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiments of the present invention are applied to the method of manufacturing the blue-violet and green semiconductor laser devices and the blue-violet LED device, the present invention is not restricted to this but are also applicable for a method of manufacturing a violet or blue semiconductor laser device and a violet or blue LED device.

While the group III-V nitride-based semiconductor layer made of AlGaN, GaN or InGaN is formed on the substrate in each of the aforementioned embodiments, the present invention is not restricted to this but other group III-V nitride-based semiconductor layer made of BN, AlN, InN or TiN or alloyed semiconductors thereof may be formed.

While the ridge is provided as the waveguide in each of the aforementioned first to fourth embodiments, the present invention is not restricted to this but a buried-type, mesa-type or slab-type waveguide may be alternatively provided.

Figure 20:
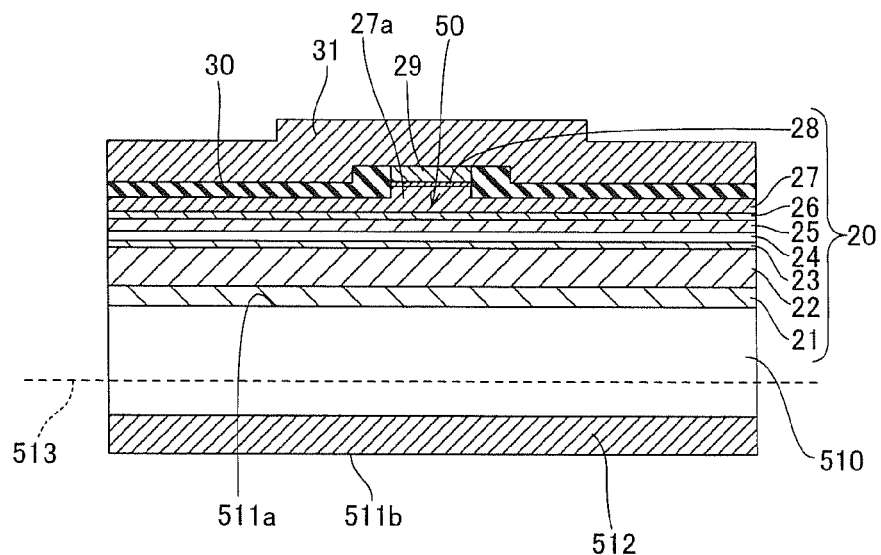
FIG. 20 is a sectional view for illustrating a manufacturing process for a semiconductor laser device according to a first modification.

While the semiconductor laser device 1 is formed by employing the substrate 10 in which the region closer to the upper surface 11a and the region closer to the lower surface 11b are separated by the dislocation concentrated region 12 arranged so as to extend parallel to the upper surface 11a as shown in FIG. 8 in the aforementioned first embodiment, the present invention is not restricted to this but a semiconductor laser device may be manufactured by employing a substrate 510 according to a first modification shown in FIG. 20. This substrate 510 includes an upper surface 511a, a lower surface 511b and a dislocation concentrated region 512 arranged so as to extend parallel to the upper surface 511a. The dislocation concentrated region 512 is so arranged as to include the lower surface 511b. According to this first modification, all of the dislocation concentrated region 512 can be removed by polishing from a side closer to the lower surface 511b to a broken line 513 in a state shown in FIG. 20.

Figure 21:
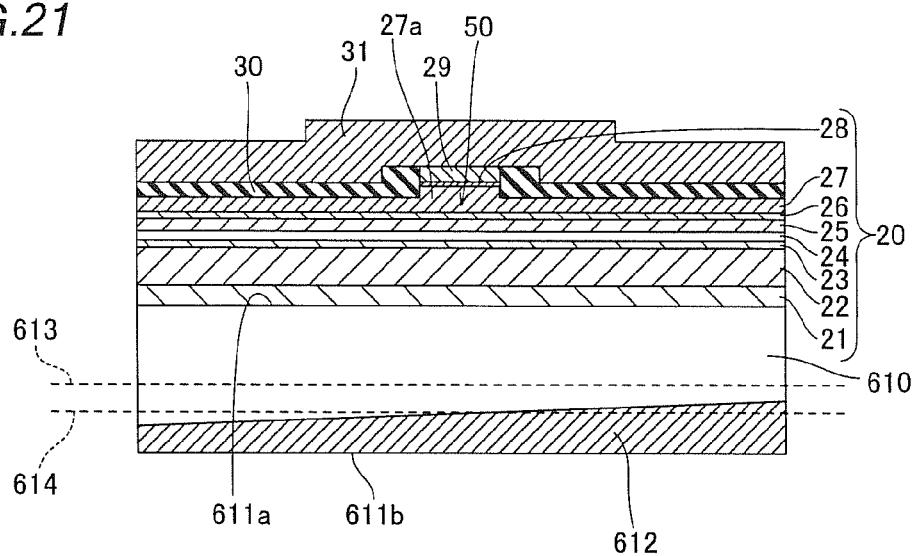
FIG. 21 is a sectional view for illustrating a manufacturing process for a semiconductor laser device according to a second modification.

While the semiconductor laser device 100 is formed by employing the substrate 110 in which the region closer to the upper surface 111a and the region closer to the lower surface 111b are separated by the dislocation concentrated region 112 arranged so as to obliquely extend to the upper surface 111a as shown in FIG. 13 in the aforementioned second embodiment, the present invention is not restricted to this but a semiconductor laser device may be manufactured by employing a substrate 610 according to a second modification shown in FIG. 21. This substrate 610 includes an upper surface 611a, a lower surface 611b and a dislocation concentrated region 612 arranged so as to obliquely extend with respect to the upper surface 611a. The dislocation concentrated region 612 is arranged so as to include the lower surface 611b. According to this second modification, all of the dislocation concentrated region 612 is removed by polishing from a side closer to the lower surface 611b to a broken line 613 in a state shown in FIG. 21. The dislocation concentrated region 612 may be partially removed by polishing from the side closer to the lower surface 611b to a broken line 614, and a portion where the dislocation concentrated region 612 does not exist above the lower surface 611b may be exposed on the lower surface 611b.

Figure 22:
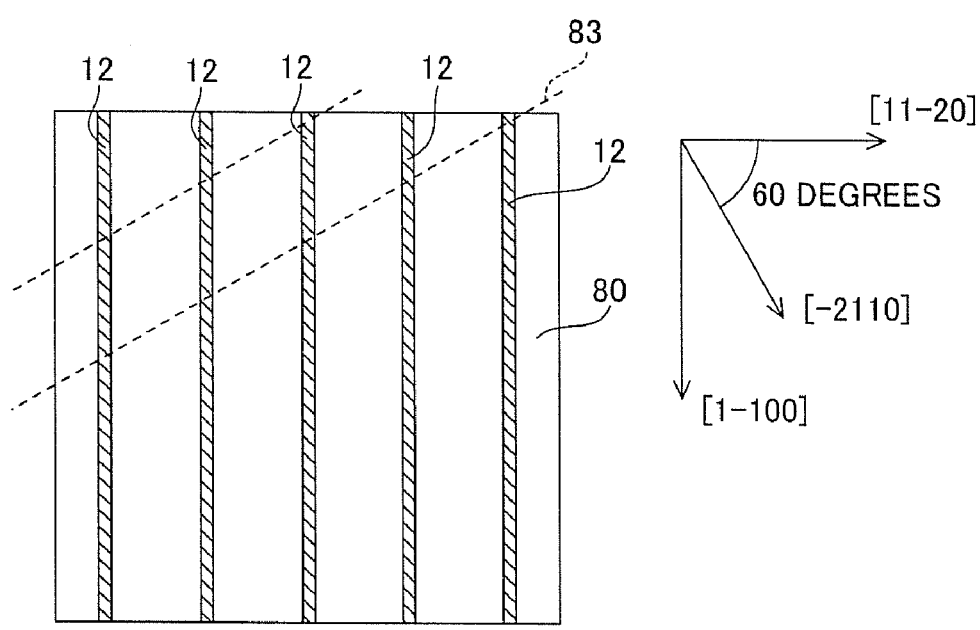
FIG. 22 is a plan view for illustrating a manufacturing process for a substrate according to a modification of the second embodiment, as viewed from a [0001] direction.

While the substrate 110 formed by slicing the GaN layer 80 along the slice plane 82 parallel to the (10-10) plane inclined from the (11-20) plane in the [1-100] direction by about 30 degrees as shown in FIG. 11 is employed in the aforementioned second embodiment, the present invention is not restricted to this but a substrate formed by slicing the GaN layer 80 along a slice plane 83 parallel to a (−2110) plane inclined from the (11-20) plane in the [1-100] direction by about 60 degrees as shown in FIG. 22 may be employed. The inclination angle of the dislocation concentrated region with respect to the upper surface of the substrate is not restricted to 30 degrees and 60 degrees, but may be any inclination angle other then 30 degrees and 60 degrees.

While the substrate 10 including the dislocation concentrated region 12 arranged so as to extend substantially parallel to the upper surface 11a is formed by slicing the GaN layer 80, in which the dislocation concentrated regions 12 is formed parallel to the (11-20) plane, along the slice plane 81 parallel to the (11-20) plane, the present invention is not restricted to this but a substrate including a dislocation concentrated region arranged so as to extend substantially parallel to an upper surface may be formed by slicing a GaN layer, in which a dislocation concentrated region is formed parallel to a (1-100) plane, along a slice plane parallel to the (1-100) plane.

What is claimed is:

1. A semiconductor device comprising:
a substrate including an upper surface, a lower surface and a dislocation concentrated region obliquely extending with respect to said upper surface and arranged so as to part a first side closer to said upper surface and a second side closer to said lower surface;
a semiconductor device layer formed on said upper surface; and
an electrode formed on said lower surface, wherein said semiconductor device layer includes a waveguide,
a region of said substrate under said waveguide exists within only either said first side or said second side,
a cavity facet of said waveguide is formed parallel to a (0001) plane, and
said upper surface is substantially equal to a nonpolar plane.

2. The semiconductor device according to claim 1, wherein said upper surface is substantially equal to a (10-10) plane, (−2110) plane or a plane equivalent to these planes.

3. The semiconductor device according to claim 1, wherein said dislocation concentrated region is so arranged as to extend from said first side to said second side.

4. The semiconductor device according to claim 1, wherein said waveguide is so formed as to be located above a first region except a first area where said dislocation concentrated region is present in said upper surface.

5. The semiconductor device according to claim 1, wherein said waveguide is so formed as to be located above a second region except a second area where said dislocation concentrated region is present in said lower surface.

6. The semiconductor device according to claim 1, wherein said waveguide extends along a [0001] direction.

7. The semiconductor device according to claim 1, wherein said substrate and said semiconductor device layer are made of a nitride-based semiconductor.

8. The semiconductor device according to claim 1, wherein said semiconductor device layer is a semiconductor light-emitting device layer including an emission layer.

9. A semiconductor device comprising:
a substrate including an upper surface, a lower surface and a dislocation concentrated region obliquely extending with respect to said upper surface and arranged so as to part a first side closer to said upper surface and a second side closer to said lower surface;
a semiconductor device layer formed on said upper surface; and
an electrode formed on said lower surface, wherein said semiconductor device layer includes a waveguide, a region of said substrate under said waveguide exists within only either said first side or said second side, a cavity facet of said waveguide is formed parallel to a (0001) plane, and said dislocation concentrated region is formed parallel to a (11-20) plane.

10. A semiconductor device comprising:

a substrate including an upper surface, a lower surface and a dislocation concentrated region obliquely extending with respect to said upper surface and arranged so as to part a first side closer to said upper surface and a second side closer to said lower surface;

a semiconductor device layer formed on said upper surface; and an electrode formed on said lower surface, wherein said semiconductor device layer includes a waveguide, a region of said substrate under said waveguide exists within only either said first side or said second side, and a cavity facet of said waveguide is formed parallel to a (0001) plane, the semiconductor device further comprising a ridge formed on said upper surface, wherein said waveguide is formed on a lower domain of said ridge.

* * * * *